US012317463B2

(12) United States Patent
Kim

(10) Patent No.: US 12,317,463 B2
(45) Date of Patent: May 27, 2025

(54) INVERTER MOUNTING STRUCTURE

(71) Applicant: LS ELECTRIC CO., LTD., Anyang-si (KR)

(72) Inventor: Dong Sik Kim, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 347 days.

(21) Appl. No.: 17/773,656

(22) PCT Filed: Apr. 1, 2020

(86) PCT No.: PCT/KR2020/004454
§ 371 (c)(1),
(2) Date: May 2, 2022

(87) PCT Pub. No.: WO2021/085763
PCT Pub. Date: May 6, 2021

(65) Prior Publication Data
US 2022/0416680 A1 Dec. 29, 2022

(30) Foreign Application Priority Data

Nov. 1, 2019 (KR) .................. 20-2019-0004430

(51) Int. Cl.
*H05K 7/14* (2006.01)
*H05K 9/00* (2006.01)
(52) U.S. Cl.
CPC ......... *H05K 9/0064* (2013.01); *H05K 7/1401* (2013.01)

(58) Field of Classification Search
CPC ... H02M 7/003; H05K 7/1401; H05K 9/0064; H05K 7/1432
See application file for complete search history.

(56) References Cited

U.S. PATENT DOCUMENTS 7,297,008 B2 * 11/2007 Griffin ................. H05K 7/1409
439/157
7,874,776 B1 * 1/2011 Lam ..................... H05K 7/1407
439/157

(Continued)

FOREIGN PATENT DOCUMENTS

CN 203522502 U 4/2014
JP 2005151675 A 6/2005

(Continued)

OTHER PUBLICATIONS

European Search Report for related European Application No. 20883062.0; action dated Nov. 23, 2023; (9 pages).

(Continued)

*Primary Examiner* — Imani N Hayman
*Assistant Examiner* — Hung Q Dang
(74) *Attorney, Agent, or Firm* — K&L Gates LLP

(57) ABSTRACT

The present disclosure relates to an inverter mounting structure having improved ease of assembly and durability, and capable of simplifying the structure of an inverter. According to one aspect of the present invention, provided is an inverter mounting structure comprising: a bracket fixed to an (Continued)

enclosure or a wall surface and forming an inverter accommodation space in which the inverter is accommodated and coupled; and an option case coupled to the outside of the bracket.

9 Claims, 7 Drawing Sheets

(56) References Cited

U.S. PATENT DOCUMENTS

| | | | | |
|---|---|---|---|---|
| 8,416,563 | B2* | 4/2013 | Hou | H05K 7/1489 |
| | | | | 361/679.33 |
| 8,611,103 | B2* | 12/2013 | Thomas | H05K 7/1489 |
| | | | | 361/801 |
| 9,115,707 | B2* | 8/2015 | Hattori | H02K 11/33 |
| 9,241,430 | B2 | 1/2016 | Crouch et al. | |
| 9,730,356 | B2* | 8/2017 | Franz | G11B 33/1426 |
| 10,058,006 | B2* | 8/2018 | Hung | H05K 5/0221 |
| 10,117,350 | B2* | 10/2018 | Kuang | H05K 7/1409 |
| 10,206,302 | B2* | 2/2019 | Liao | G06F 1/183 |
| 10,349,553 | B2* | 7/2019 | Nguyen | H05K 7/18 |
| 2002/0125029 | A1 | 9/2002 | Hussaini | |
| 2011/0069451 | A1 | 3/2011 | Hobein et al. | |
| 2013/0037335 | A1 | 2/2013 | Sakamoto | |
| 2013/0130528 | A1* | 5/2013 | Jun | H05K 7/1409 |
| | | | | 439/160 |
| 2013/0294039 | A1 | 11/2013 | Chao | |
| 2017/0311475 | A1 | 10/2017 | O'Connor et al. | |
| 2019/0075666 | A1* | 3/2019 | Ehlen | H05K 5/03 |

FOREIGN PATENT DOCUMENTS

| | | |
|---|---|---|
| JP | 2013055807 A | 3/2013 |
| JP | 2016013966 A | 6/2016 |
| KR | 200481602 Y1 | 10/2016 |
| KR | 1020190091603 A | 8/2019 |
| KR | 1020190095734 | 12/2019 |

OTHER PUBLICATIONS

International Search Report for related International Application No. PCT/KR2020/004454; report dated May 6, 2021; (5 pages).
Written Opinion for related International Application No. PCT/KR2020/004454; report dated May 6, 2021; (4 pages).
ABB; "ACS550 User's Manual"; 2014; (326 pages).
Office Action for related Chinese Application No. 202080075106.1; action dated Apr. 11, 2025; (8 pages).

* cited by examiner

INVERTER MOUNTING STRUCTURE

CROSS-REFERENCE TO RELATED APPLICATION

The present application is a National Stage of International Application No. PCT/KR2020/004454 filed on Apr. 1, 2020, which claims priority to and the benefit of Korean Utility Model Application No. 20-2019-004430, filed on Nov. 1, 2019, the disclosure of which is incorporated herein by reference in its entirety.

FIELD

The present disclosure relates to an inverter mounting structure, and more particularly, to an inverter mounting structure having improved ease of assembly and durability, and capable of simplifying the structure of an inverter.

BACKGROUND

As the range of use of electric motors is expanded, the use of inverters is also increasing. Such an inverter is used by being coupled to a wall surface or an enclosure, and various devices may be optionally mounted to the inverter as necessary.

These additional attachments are referred to as option units, and such an option unit may include, for example, a cable fixing case for fixing a cable electrically connected to the inverter so that the cable is not detached or broken by the load of the cable itself or other external force.

FIGS. 1 to 3 are views illustrating a conventional inverter and an option unit mounted to the inverter.

As shown in FIGS. 1 and 2, the conventional inverter 10 is provided with a heat sink 20 for heat dissipation on one side, and also has a structure in which an option unit 30 such as a cable fixing case is mounted on any one surface of the outside.

That is, in the inverter 10, the heat sink 20 is coupled and mounted to an enclosure or a wall surface, and grounding may be made through the heat sink 20.

In addition, the option unit 30 may be coupled to the inverter 10 by being fastened to a plurality of locations.

In this case, as shown in FIG. 3, a metal piece 32 in a form in which a part of the option unit 30 is extended is inserted and coupled to the inside of the inverter 10, and the inserted place is formed to be electrically connected to a ground path 12 inside the inverter 10 in order to maintain the ground.

In addition, the ground path 12 may be formed to be electrically connected to even the heat sink 20 made of metal, so that the heat sink 20 may be grounded by contacting the enclosure or the wall surface.

The mounting structure of the option unit 30 mounted to the conventional inverter 10 has the following problems.

First, since the option unit 30 is coupled to the inverter 10 and the load applied to the option unit 30 is applied to the inverter 10, the inverter 10 should be manufactured to have high rigidity, and therefore, there is a problem in that the manufacturing cost and weight of the inverter 10 are increased.

Second, as a structure in which the heat sink 20 attached to the inverter 10 is coupled to an enclosure or a wall surface, the heat sink 20 serves to fix the inverter 10 in addition to its original role of heat dissipation, so it has to be manufactured to withstand the load, and thus there is a problem in that the manufacturing cost and weight increase because it should be manufactured to have high rigidity.

Third, since the option unit 30 is combined with the inverter 10, a ground path 12 should be formed inside the inverter 10 for grounding, and this ground path 12 should be manufactured to be exposed to the outside for coupling with the heat sink 20 and the option unit 30, and as such, since the ground path should be formed inside the inverter 10, there is a problem in that the design and manufacture of the inverter 10 becomes difficult, and under certain installation conditions, there is a problem in that the ground path 12 exposed to the outside may be adversely worked.

The above information disclosed in this Background section is only for enhancement of understanding of the background of the disclosure and it may therefore contain information that does not form the prior art that is already known to a person of ordinary skill in the art.

SUMMARY

The present disclosure has been made to solve the above-mentioned problems, and is directed to providing an inverter mounting structure that is easy to install, has a strong structure, and can simplify the manufacture and design of the inverter.

The technical problems of the present disclosure are not limited to the technical problems mentioned above, and other technical problems not mentioned will be clearly understood by those of ordinary skill in the art from the following description.

One aspect of the present disclosure is directed to providing an inverter mounting structure including: a bracket fixed to an enclosure or a wall surface and forming an inverter accommodation space in which the inverter is accommodated and coupled; and an option case coupled to the outside of the bracket.

The bracket may include a first surface formed to face an enclosure or a wall surface, and to which an inverter is coupled; a second surface extending from the first surface in a direction perpendicular to the enclosure or wall surface and formed in parallel to face each other on opposite sides of the first surface to form a side surface of the inverter accommodation space; and a fixing part extending bent from the first surface toward the enclosure or wall surface, and having a fixing hole fixed to the enclosure or the wall surface, and one end of each of the second surfaces may be bent in a direction facing each other to form a flange part.

The option case may be mounted by being coupled to the flange part.

The option case may be provided with a grounding part to which a ground wire mounted on an earth terminal of the inverter is electrically coupled.

The bracket and the option case may be formed of a conductive material for grounding the inverter.

The second surface may be formed to expose a portion of the side surface of the inverter, and at least one vent hole may be formed therein.

A plurality of through holes through which a cable electrically connected to the inverter is coupled may be formed in the option case.

In addition, another aspect of the present disclosure is directed to providing an inverter mounting structure, including: a bracket fixed to an enclosure or a wall surface in a grounded state and forming an inverter accommodation space in which the inverter is accommodated and coupled; an option case coupled to the outside of the inverter accommodation space of the bracket and formed to be in electrical communication with the bracket; and a grounding part provided in the option case such that a ground wire mounted on the earth terminal of the inverter is electrically coupled.

According to the inverter mounting structure of the present disclosure, there are the following effects.

Conventionally, it was necessary to design a ground path in which a metal structure for grounding is disposed in both the part in contact with an inverter and an option case and the part in contact with the inverter and an enclosure, however, according to the inverter mounting structure of the present disclosure, in general, all inverters have an earth terminal, and grounding can be done through the earth terminal, so there is no need to form a separate ground path, thereby simplifying the design and reducing the manufacturing cost.

The effects of the present disclosure are not limited to those mentioned above, and other effects not mentioned will be clearly understood by those of ordinary skill in the art from the description of the claims.

BRIEF DESCRIPTION OF THE DRAWINGS

The summary set forth above as well as the detailed description of the preferred embodiments of the present disclosure set forth below may be better understood when read in conjunction with the accompanying drawings. Preferred embodiments are shown in the drawings for the purpose of illustrating the present disclosure. It should be understood, however, that the present disclosure is not limited to the precise arrangement and means illustrated.

The above and other aspects, features, and advantages of the present disclosure will become more apparent to those of ordinary skill in the art by describing embodiments thereof in detail with reference to the accompanying drawings, in which.

DETAILED DESCRIPTION

Figure 1:
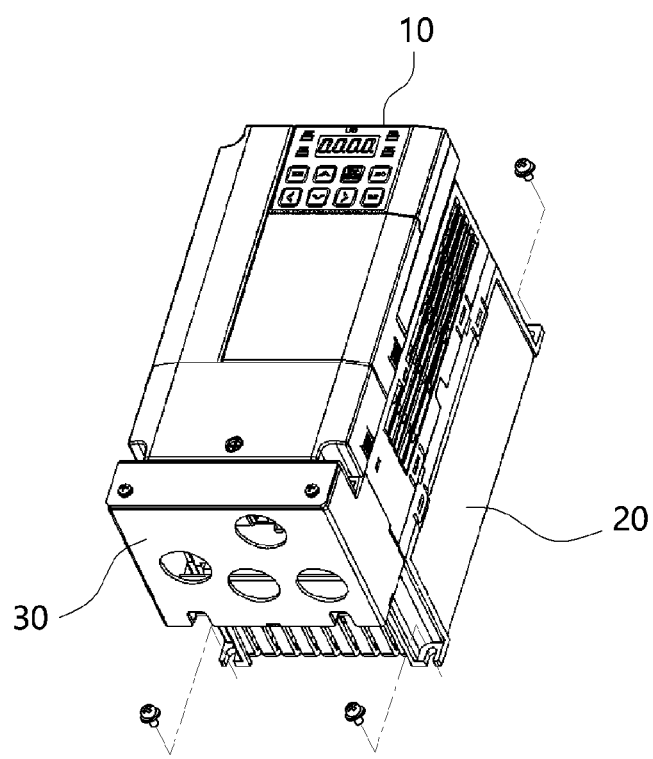
FIG. 1 is a view showing a conventional inverter fixed to a wall surface.
Figure 2:
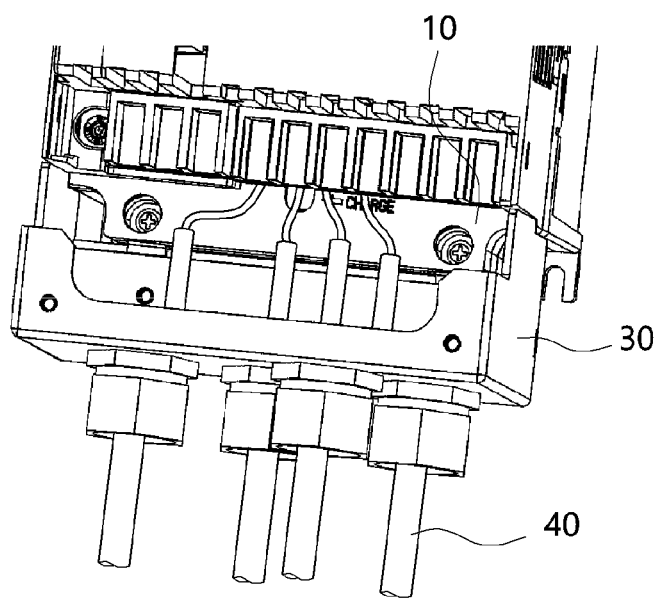
FIG. 2 is a view showing an option case coupled to the inverter of FIG. 1.
Figure 3:
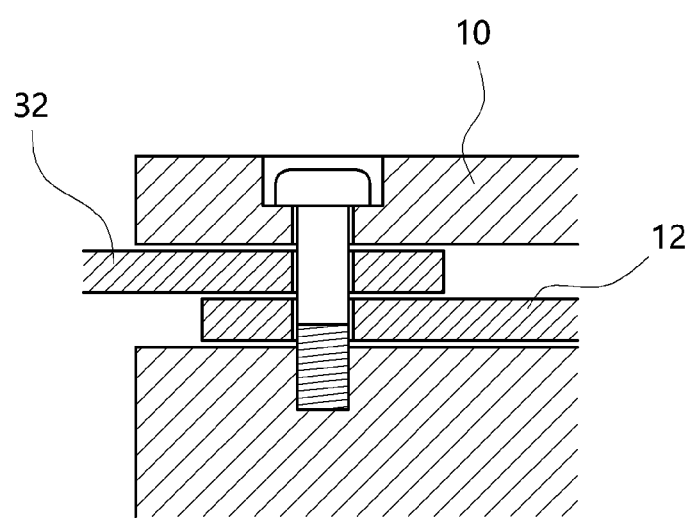
FIG. 3 is a view showing a coupling portion between an option case and an inverter, wherein the option case is electrically connected to a ground path of the inverter.

Hereinafter, various embodiments will be described in more detail with reference to the accompanying drawings. Embodiments according to the present disclosure may be variously modified. Specific embodiments may be depicted in the drawings and described in detail in the detailed description. However, specific embodiments disclosed in the accompanying drawings are only intended to facilitate understanding of various embodiments. Therefore, the technical idea is not limited by the specific embodiments disclosed in the accompanying drawings, and it is to be understood as including all equivalents or substitutes included in the spirit and scope of the disclosure.

Terms including ordinal numbers such as first and second may be used to describe various elements, but these elements are not limited by the above-described terms. The above-described terms are used only for the purpose of distinguishing one element from another.

It is understood that the terms "comprise" or "have", when used in the embodiments of the present disclosure, are intended to specify the presence of stated features, integers, steps, operations, elements, components or a combination thereof described in the embodiments of the present disclosure but not preclude the possibility of the presence or addition of one or more other features, integers, steps, operations, elements, components, or a combination thereof. When an element is referred to as being "connected" or "linked" to other element, it will be understood that it can be directly connected or linked to the other element but intervening elements may also be present. On the other hand, when an element is referred to as being "directly connected" or "directly linked" to other element, it will be understood that there are no intervening elements present.

Meanwhile, a "module" or "unit, part, or member" for an element used in an embodiment of the present disclosure performs at least one function or operation. And, the "module" or "unit, part, or member" may perform a function or operation by hardware, software, or a combination of hardware and software. In addition, a plurality of "modules" or a plurality of "units, parts, or members" excluding "module" or "unit, part, or member" to be performed in a specific hardware or performed by at least one processor may be integrated into at least one module. Expressions in the singular include plural expressions unless the context clearly indicates otherwise.

In addition, in describing an embodiment of the present disclosure, when it is determined that a detailed description of a related known function or configuration may unnecessarily obscure the subject matter of the present disclosure, the detailed description thereof will be abbreviated or omitted.

Hereinafter, an embodiment of an inverter mounting structure of the present disclosure will be described.

Figure 4:
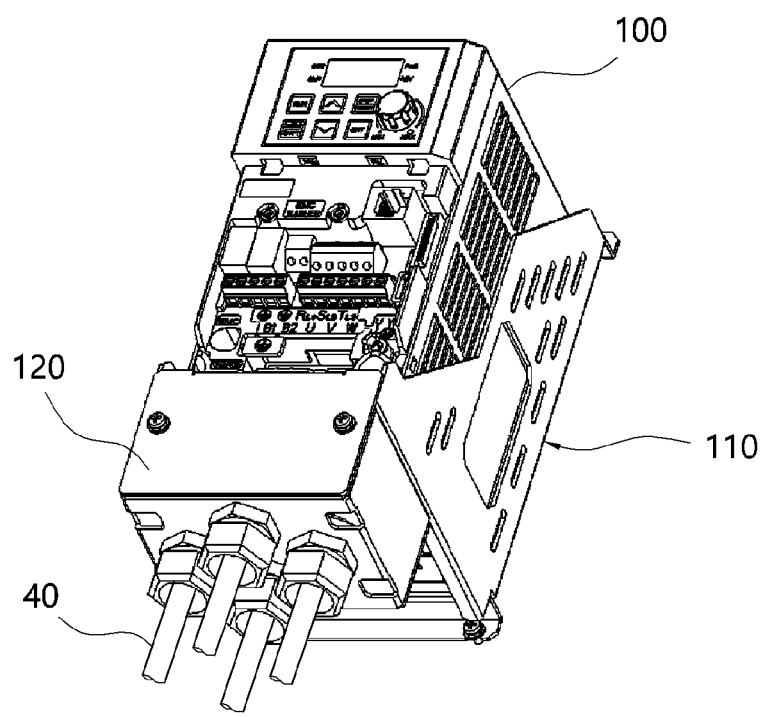
FIG. 4 is a view showing an inverter mounting structure according to an exemplary embodiment of the present disclosure.
Figure 5:
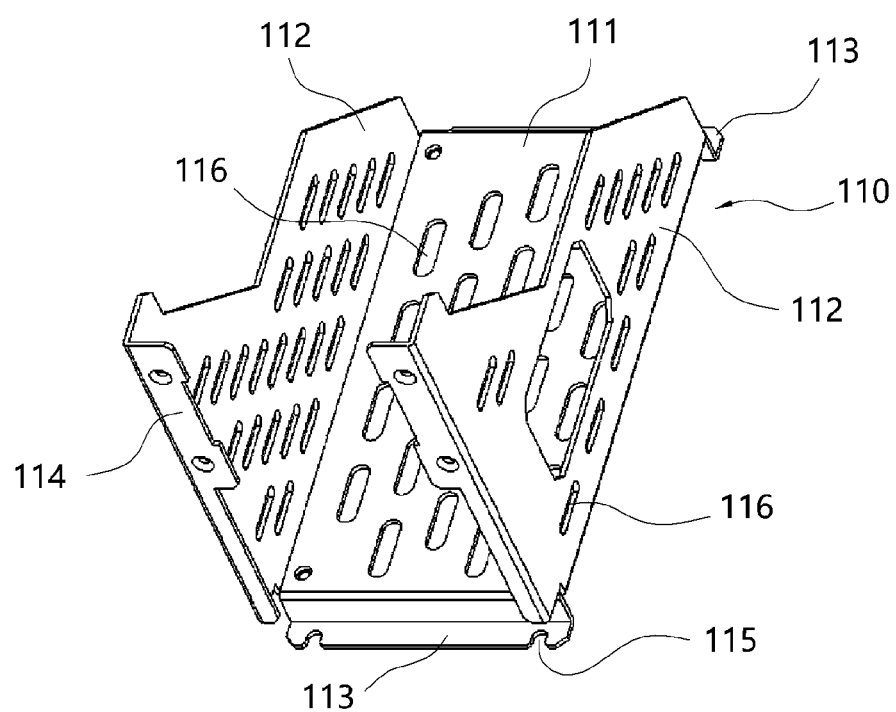
FIG. 5 is a view showing a bracket of FIG. 4.
Figure 6:
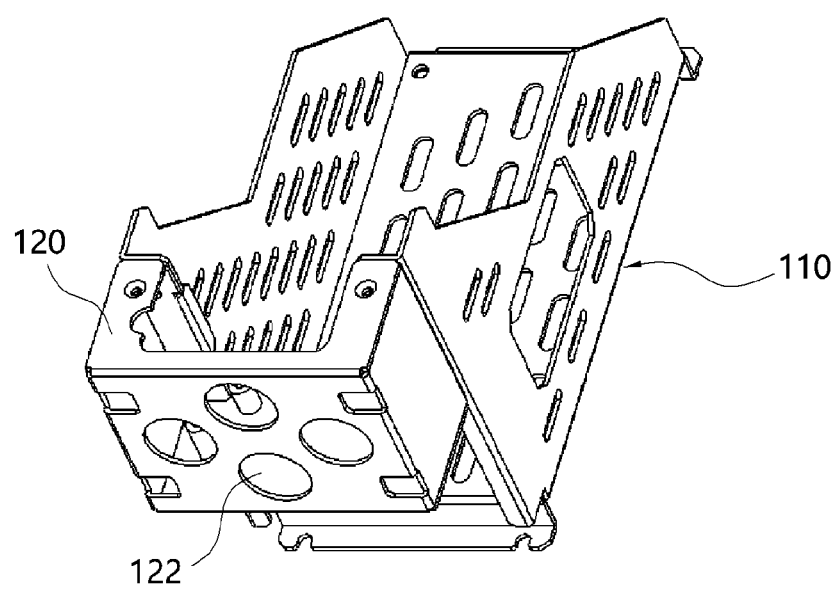
FIG. 6 is a view showing an option case coupled to the bracket of FIG. 4.

The inverter mounting structure according to the present embodiment may include a bracket 110 and an option case 120 as shown in FIGS. 4 to 6.

The bracket 110 may be fixed to an enclosure or a wall surface, and an inverter 100 may be coupled therein to form an inverter accommodation space for accommodating the inverter 100. In this case, the enclosure and the wall surface may be in a state in which they are grounded with the ground.

In addition, the option case 120 is a case for accommodating or mounting various optional devices additionally attached to the inverter 100, and may be coupled to the outside of the bracket 110.

In this embodiment, it will be described as an example that a cable fixing case is applied as the option case 120 in which the cable fixing case fixes a cable 40 or the like that is electrically connected to the inverter 100 so as to transmit and receive power or a signal, so that the cable 40 is not detached or broken by the load of the cable 40 itself or other external force.

To this end, a plurality of through holes 122 through which the cable 40 electrically connected to the inverter 100 is coupled and fixed may be formed in the option case 120. A cable fixing nut or the like capable of fixing the cable 40 may be coupled to the through hole 122 to fix the cable 40 to the option case 120. That is, since the cable 40 is fixed to the option case 120, a load or an external force applied to the cable 40 may be applied to the option case 120 rather than to the portion where the inverter and the cable 40 are bound, so that the cable fixing force may be strengthened.

Of course, the option case 120 is not limited thereto, and the option case 120 for other functions and purposes may be mounted thereon.

That is, since the option case 120 is fixed to the bracket 110 instead of the inverter 100, the load applied to the option case 120 can be directly transmitted to the bracket 110 rather than the inverter 100, thereby reducing the force applied to the inverter 100. Therefore, there is no need to manufacture the inverter 100 excessively strong, and in particular, in the case of a heat sink, it can be simplified as much as no load is applied, and thus the weight can be further reduced.

The bracket 110 may include a first surface 111, a second surface 112, a fixing part 113, and a flange part 114.

The first surface 111 may be formed to face an enclosure or a wall surface to which the bracket 110 is fixed, and the inverter 100 may be coupled thereto. In this case, the first surface 111 may form a flat surface, but is not limited thereto. One or more screw holes for coupling the inverter 100 may be formed on the first surface 111.

The second surface 112 may extend from opposite sides of the first surface 111 in a direction perpendicular to the enclosure or wall surface to form together with the first surface 111 an inverter accommodation space in which the inverter 100 is accommodated. A pair of the second surfaces 112 may be formed to extend in parallel to face each other.

In this case, the second surface 112 may be provided to expose at least a portion of the side surface of the inverter 100 without covering all of it. This is to easily hold the inverter 100 when the inverter 100 is placed in or removed from the inverter accommodation space.

Meanwhile, a fixing hole 115 may be formed in the fixing part 113 so that the fixing part is extended bent from the edge of the first surface 111 toward an enclosure or wall surface to be fixed to the enclosure or the wall surface. Of course, if necessary, the fixing part 113 may extend flat rather than bent from the edge of the first surface 111, and the fixing hole 115 may be formed in the edge.

In addition, a fixing means for fixing the bracket 110 through the fixing hole 115 may be a screw or a bolt or the like, but is not necessarily limited thereto, and other fixing means such as a rivet may be used.

That is, the inverter 100 is fixed to the first surface 111, and the first surface 111 to which the inverter 100 is fixed is fixed to an enclosure or a wall surface by the fixing part 113 formed on the first surface 111.

In this case, a plurality of vent holes 116 for heat dissipation may be formed in the first surface 111 and the second surface 112.

In addition, a surface facing the first surface 111 may be opened. In general, various operation switches or I/O panel covers are provided on the surface opposite to the surface facing the first surface 111 of the inverter, and so the corresponding surface may be opened to avoid interference with them.

In addition, one end of the second surface 112 may be bent in a direction facing each other to form a flange part 114, and the option case 120 may be coupled to the flange part 114 to be fixed to the bracket 110. That is, the option case 120 may be fastened to the flange part 114 by a fixing means such as a screw or a bolt and a nut.

Meanwhile, the bracket 110 and the option case 120 may be formed of a conductive material such as metal for grounding the cables mounted on the inverter 100 and the option case 120.

Figure 7:
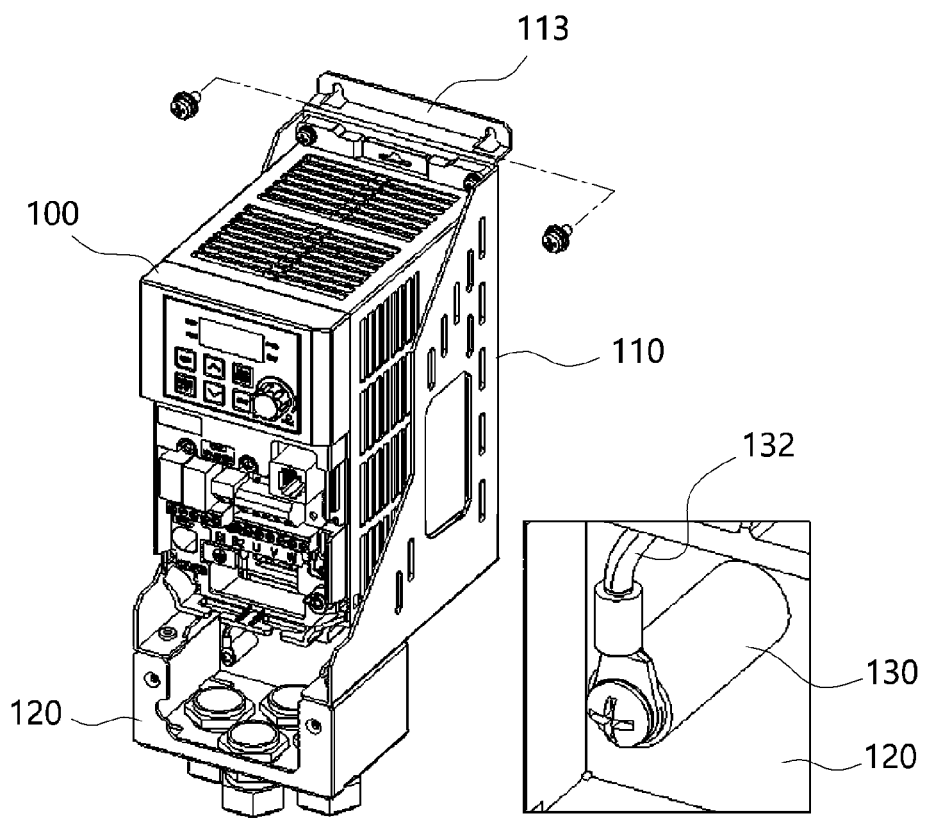
FIG. 7 is a view showing a state in which a ground wire is coupled to a grounding part.

In addition, as shown in FIG. 7, for the grounding of the inverter 100, the option case 120 may be provided with a grounding part 130. A ground wire 132 connected to an earth terminal of the inverter may be coupled to the grounding part 130. In this case, a conductive bolt or the like may be used to couple the ground wire 132 and the grounding part 130.

Accordingly, since the ground wire 132 connected to the earth terminal of the inverter 100 is connected to the grounding part 130 of the option case 120 and the option case 120 is in contact with the bracket 110 directly electrically connected to the enclosure or wall surface, the inverter 100 and the option case 120 can be grounded without forming a separate ground path 12 in the inverter 100 or exposing the ground path 12 to the outside.

That is, since the inverter 100 is essentially provided with an earth terminal therein, in this embodiment, the need to separately form the ground path 12 can be eliminated by performing grounding using the earth terminal essentially provided.

Accordingly, the design of the inverter 100 may be further simplified, and thus the design and manufacture may be facilitated. In addition, the number of parts required to manufacture the inverter 100 can be reduced accordingly, so that the cost of parts as well as the number of man-hours can be reduced, so that the manufacturing cost can be expected to be reduced.

As described above, preferred embodiments according to the present disclosure have been examined, and it is obvious to those skilled in the art that the present disclosure can be embodied in other specific forms without departing from the spirit or scope of the disclosure in addition to the above-described embodiments. Therefore, the above-described embodiments are to be construed as illustrative rather than restrictive, and accordingly, the present disclosure is not limited to the above description and may be modified within the scope of the appended claims and their equivalents.

What is claimed is:

1. An inverter mounting structure, comprising:
    a bracket fixed to an enclosure or a wall surface and forming an inverter accommodation space in which an inverter is accommodated and coupled;
    a case coupled to an outside of the bracket; and
    wherein the bracket comprises:
        a first surface formed to face the enclosure or the wall surface, and to which an inverter is coupled; and
        a second surface extending from the first surface in a first direction perpendicular to the enclosure or wall surface to form a side surface of the inverter accommodation space; and
        a third surface extending from the first surface in the direction perpendicular to the enclosure or wall surface to form an additional side surface of the inverter accommodation space,
    wherein the second surface extends in parallel to the third surface to face each other on opposite sides of the first surface;
    wherein one end of each of the second surface and the third surface is bent in a second direction facing each other to each form a flange part, and the case is mounted by being coupled to the flange part of the second surface and the flange part of the third surface.

2. The inverter mounting structure of claim 1, further comprising a fixing part extending from the first surface toward the enclosure or wall surface, and having a fixing hole through which a fixing means fixed to the enclosure or the wall surface passes.

3. The inverter mounting structure of claim 1, wherein the case is provided with a grounding part to which a ground wire mounted on an earth terminal of the inverter is electrically coupled.

4. The inverter mounting structure of claim 3, wherein the bracket and the case are formed of a conductive material for grounding the inverter.

5. The inverter mounting structure of claim 1, wherein the second surface is formed to expose a portion of the side surface of the inverter, and at least one vent hole is formed therein.

6. The inverter mounting structure of claim 1, wherein at least one through hole through which a cable electrically connected to the inverter is coupled is formed in the case.

7. An inverter mounting structure, comprising:
  a bracket forming an inverter accommodation space in which an inverter is accommodated and coupled; and
  a case coupled to an outside of the bracket;
  wherein the bracket comprises:
    one first surface to which the inverter is coupled; and
    two second surfaces extending in parallel to each other from opposing sides of the first surface in a first direction perpendicular to the first surface to respectively form a first side surface and a second side surface of the inverter accommodation space; and
    wherein a first end of each of the two second surfaces is bent inwardly relative to each other in a second direction perpendicular to the first direction to respectively form a first flange part and a second flange part, wherein the case is mounted by being coupled to the first flange part and the second flange part.

8. The inverter mounting structure of claim 7, wherein the bracket further comprises:
  two fixing parts extending in parallel to each other from opposing sides of the first surface, different from the opposing side of the first surface from which the two second surfaces extend, the two fixing parts extending in a second direction perpendicular to the first surface and opposite to the first direction to respectively form a first fixing hole and a second fixing hole by which fixing means fix the bracket to a mounting surface.

9. The inverter mounting structure of claim 7, wherein the case is not fixed to the inverter.

\* \* \* \* \*